United States Patent
Payman (10) Patent No.: US 7,385,410 B2
(45) Date of Patent: Jun. 10, 2008

(54) METHOD OF AND APPARATUS FOR TESTING FOR INTEGRATED CIRCUIT CONTACT DEFECTS

(75) Inventor: Richard John Payman, St. Albans (GB)

(73) Assignee: Aeroflex International Limited, of Longacres House, Hertfordshire (GB)

( * ) Notice: Subject to any disclaimer, the term of this patent is extended or adjusted under 35 U.S.C. 154(b) by 35 days.

(21) Appl. No.: 10/533,188

(22) PCT Filed: Oct. 27, 2003

(86) PCT No.: PCT/GB03/04640

§ 371 (c)(1),
(2), (4) Date: Sep. 28, 2005

(87) PCT Pub. No.: WO2004/040324

PCT Pub. Date: May 13, 2004

(65) Prior Publication Data

US 2006/0097741 A1    May 11, 2006

(30) Foreign Application Priority Data

Oct. 29, 2002    (GB)    ................... 0225174.2

(51) Int. Cl.
  *G01R 31/02* (2006.01)
(52) U.S. Cl. ............... 324/761; 324/537; 324/527; 324/765; 324/713
(58) Field of Classification Search ............... 324/537, 324/527, 765, 763, 713, 718, 719, 761
See application file for complete search history.

(56) References Cited

U.S. PATENT DOCUMENTS

| 4,779,041 | A |  | 10/1988 | Williamson, Jr. |
| 5,280,237 | A |  | 1/1994 | Buks |
| 5,365,180 | A |  | 11/1994 | Edelman |
| 5,399,975 | A | * | 3/1995 | Laing et al. ................ 324/537 |
| 5,521,513 | A |  | 5/1996 | Stringer |
| 5,554,928 | A |  | 9/1996 | Stringer |
| 5,736,862 | A |  | 4/1998 | Hamblin |
| 5,786,700 | A |  | 7/1998 | Jen et al. |
| 6,188,235 | B1 |  | 2/2001 | Buks et al. |
| 7,109,736 | B2 | * | 9/2006 | Long ......................... 324/765 |
| 2005/0122123 | A1 | * | 6/2005 | Stine et al. ................. 324/719 |

FOREIGN PATENT DOCUMENTS

| EP | 0 571 963 A2 | 12/1993 |
| EP | 0 622 733 A1 | 11/1994 |

OTHER PUBLICATIONS

*Analog AC Harmonic Method for Detecting Solder Opens*, C. Robinson, IEEE Proceedings of the International Test conference, 1997.
*Nonlinear Distortion Voltage Testing of Contact Surfaces*, I. Minowa et al., Conference Proceedings Article, Sep. 26, 1988, pp. 277-280.

* cited by examiner

Primary Examiner—Andrew H Hirshfeld
Assistant Examiner—John Zhu
(74) Attorney, Agent, or Firm—Alston & Bird LLP (57) ABSTRACT

Various tester configurations are provided that injects test signals into nets (e.g. 24). Non-linear characteristics of the response are detected (e.g. harmonics, do offset) and used to assess the adequacy or otherwise of device connections in the net.

11 Claims, 7 Drawing Sheets

METHOD OF AND APPARATUS FOR TESTING FOR INTEGRATED CIRCUIT CONTACT DEFECTS

BACKGROUND OF THE INVENTION

The present invention relates to a method of and apparatus for determining the integrity of a contact between an integrated circuit and a circuit board on which it is mounted. The method can be applied to complex circuit boards where many devices are in parallel.

The automatic testing of such board assemblies is common practice. CMOS and bipolar integrated circuits typically have parasitic or protection diodes between input and output pins and the device ground and power rails. This fact has been recognised and used in prior art testers to verify the integrity of component pin connections.

U.S. Pat. No. 5,280,237 and U.S. Pat. No. 6,188,235 take advantage of parasitic transistors formed in an integrated circuit by the parasitic diodes between the substrate and ground. Transistor tests are carried out in a 'grounded-emitter' configuration, and necessitate connection of device ground (GND) pins to a bias voltage, rather than to ground. Such tests are not possible to perform in situations where device ground pins are indeed connected to ground, as for example, may be the case with many commercial in-circuit testers.

U.S. Pat. No. 4,779,041 attempts to verify the presence of an internal common mode resistance connecting the diodes of each of two device pins and ground. A large current pulse applied to a second terminal causes a voltage drop across the inherent internal resistance, which then appears as a corresponding change in voltage at a first terminal subjected to a constant bias current The technique suffers from several disadvantages, including false readings due to multiple connected components sharing either or both of the pulse or bias currents, parallel current paths between the two pins under test due to other components, and external common mode resistance due to circuit board traces and connection to the tester. In addition, expected responses may vary considerably between devices of different batch or manufacturer.

U.S. Pat. No. 5,521,513 and U.S. Pat. No. 5,554,928 address some of the drawbacks of U.S. Pat. No. 4,779,041 by employing an alternative method of measuring the internal common mode resistance. A voltage source is connected simultaneously to two leads of a component, and the resultant current measured. The same voltage source then is connected to each of same two leads individually, and the resultant currents measured. The common resistance between the leads (and ground) may then be calculated from the resultant currents. Unfortunately, the use of a voltage stimulus presents a considerable problem in determining a suitable voltage level. The current resulting from applying a given voltage to a device pin may vary by orders of magnitude with that resulting from the exact same voltage applied to a different device pin, introducing uncertainties into operating conditions and expected responses.

U.S. Pat. No. 5,736,862 makes use of internal AC paths between pairs of integrated circuit pins. An AC signal applied to one pin will result in an output signal of the same frequency on a second pin when both pins are correctly connected. Another similar approach applies two AC signals having different frequencies to two device pins respectively, then utilizes the non-linear characteristic of forward-biased diodes to generate sum and difference frequencies, which may then be detected at a third device pin to deduce correct connection. The first method is susceptible to error signals due to parallel paths and external common mode resistance. The latter method is complicated through the necessary choice, biasing, and connection of, three individual device pins per test.

A related method "Analog AC Harmonic Analysis Method for Detecting Solder Opens" in the IEEE Proceedings of the International Test Conference 1997 (http://www.computer.org/proceedings/itc/4210/4210toc.htm) applies an AC signal to the first pin and measures the harmonic content of the output signal on a second pin of the same device, which reduces the number of undetected faults due to parallel paths.

EP 0,571,963 identifies multi-terminal structures formed by internal diodes between pins of similar functionality, being a general case of the parasitic transistors employed in U.S. Pat. No. 5,280,237. These structures are then biased so as to produce a set of terminal currents, which are then measured and subsequently compared, with marked variations being indicative of faulty connections. The demonstrated embodiment suffers from a problem associated with CMOS devices, being that of a large background current due to the additional parasitic diodes present between signal pins and the supply voltage pin (and addressed by U.S. Pat. No. 6,188,235). Once again, use of voltage biasing presents the problem of determining a suitable voltage for devices and pins having varying characteristics.

Each of the above techniques minimally requires two device pin connections, where the two chosen pins do not form part of the same bus, and may not both connect to pins of any other individual device. This requirement stems from the fact that, for these techniques, such parallel device connections tend to mask out the effects of any single device pin connect fault The resultant choice of two diversely functional pins may complicate selection of test stimuli, and make prediction of test response difficult or impossible.

Some methods advantageously compare results for pins within groups. The fact that these measurements have by necessity been made individually, and at separate times, introduces a measurement uncertainty, which may have considerable bearing on the integrity of test.

None of the above techniques explicitly address the problems associated with series resistance inherently present in the test path Any practical tester must electrically connect to the circuit board under test, usually using test wiring and probes, often in the form of a 'bed-of-nails'. Such connections will have an associated series resistance, which can be both large and variable in magnitude, commonly due to probe pin or connector contact resistance. An undesired effect of such resistance is to introduce errors into both applied stimuli and measured responses, thereby significantly reducing the fidelity and consistency of test.

U.S. Pat. No. 5,365,180 presents a method for measuring the contact resistance between a probe card and the wafers onto which integrated circuits are fabricated, during wafer testing. A first and second test current are forced between two pins of the device under test through an isolating diode, and first and second resultant voltage drops measured respectively. A dynamic resistance is calculated by dividing the difference in measured voltages by the difference in test currents. The contact resistance may then be determined, for example, by subtracting a predetermined internal resistance value from the calculated dynamic resistance.

U.S. Pat. No. 5,786,700 similarly determines the linear interconnection resistance between two external access points of an electronic device. Various currents or voltages are injected between the two access points, so as to forward bias an internal ESD diode, and resultant voltages or currents measured. The resultant current-voltage relationships are applied to an interconnection model algorithm to yield an interconnection resistance.

Whilst the above two methods may be useful in determining values for dynamic and static series resistance, neither of these two quantities has any intrinsic importance in the detection of unconnected device pins, especially in cases having more than one device connection on a net.

Rather, it is desirable to detect pin connection failures reliably, in the presence of unknown series resistance in the test path.

SUMMARY OF THE INVENTION

According to a first aspect of the present invention there is provided a method of testing the integrity of a plurality of semiconductor device connections within a product containing one or more semiconductor devices wherein one or more semiconductor devices include a non-linear element in a conduction path between a first node and a second node connected to a power supply connection of the devices; the method comprising the steps of: applying a test signal to the devices such that a test current flows between said nodes creating a voltage difference between said nodes, making measurements of the voltage difference as the test current varies, and on the basis of the measurements extracting a response component due predominantly to the non-linear characteristic of the devices and using this to indicate whether said semiconductor device connections are acceptable.

It is thus possible to provide a method which can test the integrity of device connections to a substrate, such as a circuit board, even when a plurality of devices are connected in parallel to the same test connection, and which is substantially independent of series resistance in the test path.

Preferably the test signal is a DC current generated by a current source, the changes in voltage resulting in changes in the current may then analysed so as to calculate a dynamic resistance offset voltage. It will be appreciated that the dynamic resistance offset voltage calculated by this method varies with different selections of test current magnitudes. Thus if for example it is desired to compare the dynamic resistance offset voltage between different groups of similar devices (so called "nets") then the test currents need to be substantially identical or at least similar or deterministically related.

The test signal may have an AC component. In such circumstances, the presence of harmonic signals generated by current flow in a non-linear device may be detected. It should be noted that where the AC response of a non-linear component is to be measured, the AC signal need not be provided in real time. Instead a series of differing DC signals may be provided. Thus the provision of other test signals in excess of the second test signal may be used to interrogate the board under test and further voltage differences measured. The currents are preferably selected to represent sample values of a sinusoidal or other waveform having little or zero low-order harmonic content corresponding to equally spaced samples in time between a trough and a peak of the waveform. These samples can then be used to interrogate the performance of the board and the integrity of connections thereon. The samples need not be applied in any particular order or at a constant rate. Provided that the data processing equipment can re-order the measured voltage into the sequence that would have occurred had the test currents been applied in order from trough to peak or vice versa This then digitally synthesises the results that would be obtained by driving the devices under test with an AC signal.

The results from two substantially identical nets (that is groups of pins connected in a similar fashion) may be compared and a faulty connection indicated if they differ by more than a predetermined threshold.

According to a second aspect of the present invention there is provided a method of testing the continuity of a connection between an integrated circuit pin and a circuit board where the integrated circuit pin is connected to a plurality of integrated circuit pins forming a first group, the method comprising the steps of: identifying a second group of integrated circuit pins having electrical properties relatable to the first group; applying one or more first test signals to the first group of pins and measuring one or more respective first voltage differences occurring between the first group of pins and a reference voltage; applying one or more second test signals to the second group of pins and measuring one or more respective second voltage differences occurring between the second group of pins and a reference voltage; and on the basis of measurements extracting and comparing a non-linear characteristic of the first and second group of pins to obtain a measure of said continuity.

Advantageously the groups are selected such that each should perform in the same way under test, i.e. similar numbers of similar device connections are in each group.

According to a third aspect of the present invention there is provided an apparatus for testing the integrity of a plurality of device connections within a product containing one or more devices, wherein one or more devices include a non-linear element in a conduction path between a first node and a second node connected to a power supply connection of each device, the apparatus comprising: signal means for applying a test signal to the devices such that a test current flows between said nodes creating a voltage difference between said nodes, a voltage measuring device for making measurements of the voltage difference as the test current varies, and a data processor arranged on the basis of the measurements to extract a response component due predominantly to the non-linear characteristic of the devices and to use this to indicate whether said device connections are acceptable.

According to a fourth aspect of the present invention there is provided an apparatus for testing the continuity of connections in a circuit path within a product, said path comprising a plurality of integrated circuit device pins forming a first group connected to a first circuit node such that current flows via the pins and through associated semiconductor junctions to a second circuit node, the apparatus comprising: first signal means for applying M test signals to the first group of pins and measuring M voltage differences occurring between the first circuit node and a reference, where M is an integer greater than zero; second signal means for applying N test signals to a second group of pins expected to have a behaviour identical to or relatable to the first group of pins and measuring N voltage differences occurring between a second circuit node connected to the second group of pins and a reference, where N is an integer greater than zero; and a processor responsive to the voltage differences for deriving or comparing a non-linear characteristic of the first and second groups of pins to obtain a measure of said continuity.

Preferably the non-linear characteristic is a dynamic offset voltage or a real or synthetic harmonic content.

Preferably M and N are equal and identical test signals are applied concurrently to the first and second groups of pins.

Preferably the difference in non-linear characteristic between the first and second group of pins used as a measure of continuity is calculated directly from respective differences in measured M and N voltage differences.

The M and N signals may be samples from a regularly sampled sinusoidal or other waveform having little or zero low-order harmonic content

BRIEF DESCRIPTION OF THE DRAWINGS

The present invention will further be described, by way of example, with reference to the accompanying drawings, in which.

DETAILED DESCRIPTION OF PREFERRED EMBODIMENTS

Figure 1:
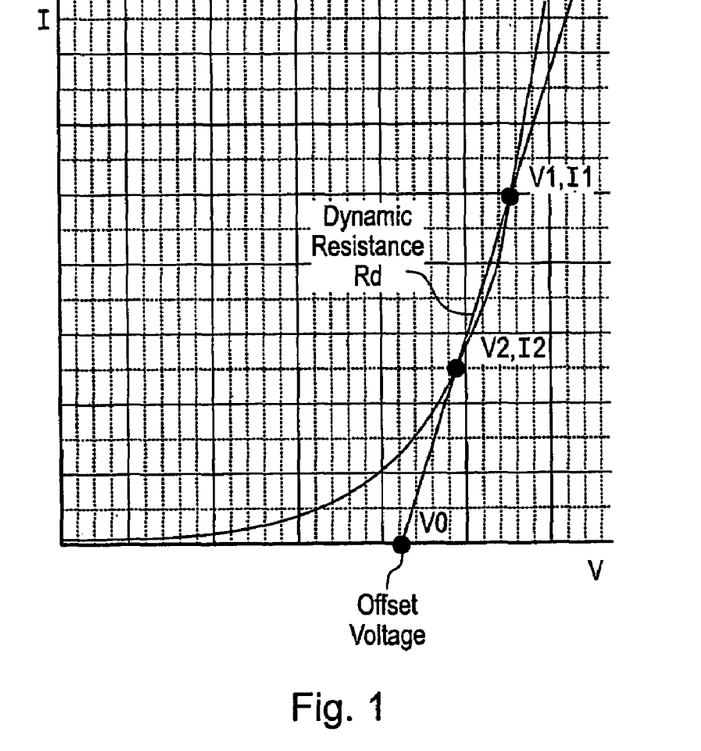
FIG. 1 is a graph illustrating the current-voltage characteristic of a diode.

FIG. 1 shows the voltage-current characteristic of a semiconductor diode. In fact it is well known that the current flow in a diode can be represented by the equation:

$$I = I_s \left( e^{\frac{qV}{kT}} - 1 \right) \quad (1)$$

where

I=current $I_s$=reverse saturation current q=charge of an election

V=Voltage k=Boltzmans constant

T=Temperature expressed in Kelvin

It can be seen that, since the ratio between voltage across the device and the current flowing through it defines the resistance of the device, a diode has a non-linear resistance. Two points on the resultant curve are shown at $V_1$, $I_1$ and $V_2$, $I_2$.

The slope of the line passing through points $V_1$, $I_1$ and $V_2$, $I_2$ corresponds to a dynamic resistance, Rd. Due to the non-linear nature of the curve, the dynamic resistance line does not pass through the origin, but rather will have an associated offset voltage, $V_0$.

The dynamic resistance Rd, is defined by the slope $$Rd = \frac{V_1 - V_2}{I_1 - I_2} \quad (2)$$

The voltage equation for the line is given by $$V(I) = V_0 + I \cdot Rd \quad (3)$$

from which we can obtain the offset voltage, $V_0$ by inserting values V2 and I2 into equation 3 and then substituting in the expression of Rd defined in equation 2.

$$V_O = \frac{V_2 I_1 - V_1 I_2}{I_1 - I_2} \quad (4)$$

Figure 2:
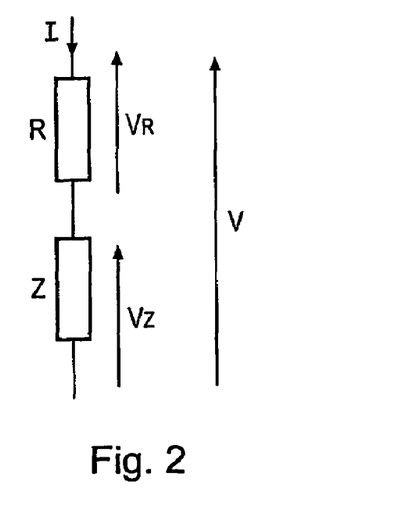
FIG. 2 illustrates the voltage contributions of a linear and non-linear device in series.

However, it is not sound to assume that there is no other resistive component in a circuit. In the context of the present invention the connections between the tester and the board under test will almost inevitably exhibit some resistance. Furthermore if probes or a "bed of nails" configuration is used then some contact resistance may occur at the interface with the board under test FIG. 2 illustrates a network of non-linear element Z in series with linear resistive element R.

If the voltage across Z at current I is given by the function Vz(I), then the total voltage across the network is given by the sum of voltages across each element $$V(I) = Vz(I) + I \cdot R \quad (5)$$

The dynamic resistance and offset voltage, defined for currents $I_1$ and $I_2$, are given by $$Rd = \frac{Vz(I_1) - Vz(I_2)}{I_1 - I_2} + R \quad (6)$$

$$V_0 = \frac{Vz(I_2)I_1 - Vz(I_1)I_2}{I_1 - I_2} \quad (7)$$

The above expression for $V_0$ is a function only of currents $I_1$, $I_2$ and resultant non-linear voltages $Vz(I_1)$, $Vz(I_2)$. It is independent of series resistance element R, which is as expected, being defined at zero current.

Figure 3:
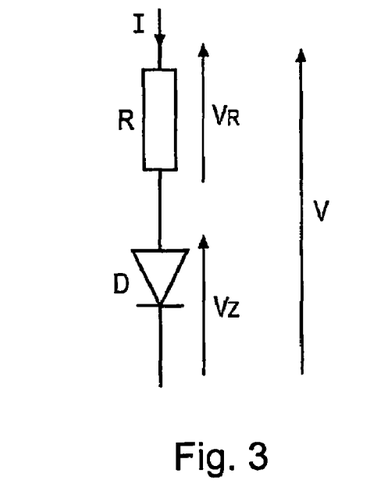
FIG. 3 illustrates the voltage contributions of a resistor and diode in series.

In FIG. 3, the non-linear voltage component Vz is due to a forward-biased junction diode D, and given by the equation $$V_z(I) = \eta V_T \ln\left(\frac{I}{I_S} + 1\right) \quad (8)$$

where
  η=Diode characteristic
  $V_T$=Thermal voltage at temperature T
  $I_S$=Reverse saturation current
In this case, the dynamic resistance Rd becomes $$R_d = \eta V_T \left(\frac{\ln(I_1 + I_S) - \ln(I_2 + I_S)}{I_1 - I_2}\right) + R \quad (9)$$

which is substantially independent of the diode reverse saturation current $I_S$.

Since it is precisely such variations in Is which characterize connect failures in the case of parallel diodes, it follows that the value Rd has no direct significance in fault detection.

By contrast, the dynamic resistance offset voltage $V_0$ becomes $$V_0 = \eta V_T \left(\frac{I_1 \ln(I_2 + I_S) - I_2 \ln(I_1 + I_S)}{I_1 - I_2} - \ln(I_S)\right) \quad (10)$$

which is equivalent to the diode forward-voltage at current $I_0$, given by the equation $$I_0 = \exp\left(\frac{I_1 \ln(I_2 + I_S) - I_2 \ln(I_1 + I_S)}{I_1 - I_2}\right) - I_S \quad (11)$$

The above equation for offset voltage $V_0$ shows it to be both dependent upon the diode reverse saturation current $I_S$, and independent of the circuit series resistance R.

This is precisely what is required for the detection of connect faults in the case of parallel diodes.

Suppose that we consider two nets A and B, each comprising a number of parallel diodes, having total reverse saturation currents of $I_{SA}$ and $I_{SB}$ respectively.

For given test currents $I_1$, $I_2$, the respective offset voltages $V_{OA}$, $V_{OB}$ are given by $$V_{OA} = \eta V_T \left(\frac{I_1 \ln(I_2 + I_{SA}) - I_2 \ln(I_1 + I_{SA})}{I_1 - I_2} - \ln(I_{SA})\right) \quad (12)$$

$$V_{OB} = \eta V_T \left(\frac{I_1 \ln(I_2 + I_{SB}) - I_2 \ln(I_1 + I_{SB})}{I_1 - I_2} - \ln(I_{SB})\right) \quad (13)$$

Taking the difference of the two voltages $V_{OA}$, $V_{OB}$ gives $$V_{OA} - V_{OB} = \eta V_T \left(\frac{\begin{array}{c}I_1(\ln(I_2 + I_{SA}) - \ln(I_2 + I_{SB})) - \\ I_2(\ln(I_1 + I_{SA}) - \ln(I_1 + I_{SB}))\end{array}}{I_1 - I_2} - \ln(I_{SA}) + \ln(I_{SB})\right) \quad (14)$$

which for practical values of $I_1, I_2 \gg I_{SA}, I_{SB}$ simplifies to $$V_{OA} - V_{OB} = \eta V_T(-\ln(I_{SA}) + \ln(I_{SB})) = \eta V_T \ln\left(\frac{I_{SB}}{I_{SA}}\right) \quad (15)$$

This equation states that the difference in offset voltages is proportional to the natural logarithm of the ratio of reverse saturation currents, and therefore provides a direct indication of the relative number of connected devices on each net.

The following equations show that it is possible to use direct differential measurements of net voltages $(V_{A2}-V_{B2})$, $(V_{A2}-V_{B1})$ in the calculation of the differential offset voltage.

$$V_{OA} = \frac{V_{A2}I_1 - V_{A1}I_2}{I_1 - I_2}, \quad (16)$$

$$V_{OB} = \frac{V_{B2}I_1 - V_{B1}I_2}{I_1 - I_2},$$

$$V_{OA} - V_{OB} = \frac{(V_{A2} - V_{B2})I_1 - (V_{A1} - V_{B1})I_2}{I_1 - I_2}$$

However, in the context of the present invention where multiple devices may be connected via a single conduction path to which the test signal is applied, we need to be able to observe changes in offset voltage.

Figure 4:
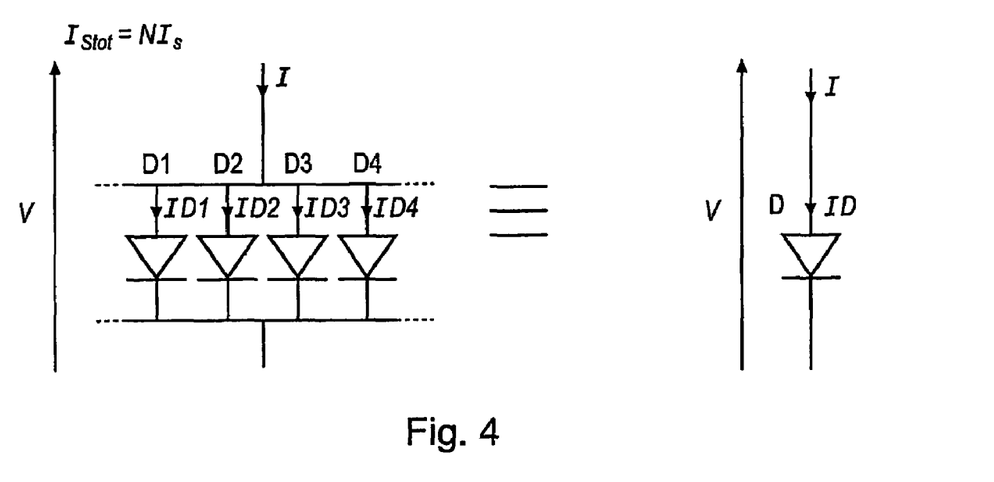
FIG. 4 illustrates the effective equivalence of a plurality of diodes in parallel, with a single larger diode.

The current $I_D$ flowing through a forward-biased diode was given in equation 1 which is sometimes presented as $$I_D = I_S\left(e^{\frac{V_D}{\eta V_T}} - 1\right) \quad (17)$$

where
  $I_S$=reverse saturation current
  $V_D$=forward voltage
  η=diode characteristic
  $V_T$=thermal voltage
For N parallel identical diodes as shown in FIG. 4, the overall current I at common voltage $V_D$ is given by $$I = \sum_{j=1}^{N} I_{Dj} = \sum_{j=1}^{N} I_{Sj}\left(e^{\frac{V_D}{\eta_j V_{Tj}}} - 1\right) \quad (18)$$

Assuming a common working temperature, and nominal diode characteristic η, this simplifies to $$I = I_{Stot}\left(e^{\frac{V_D}{\eta V_T}} - 1\right) \text{ where } I_{Stot} = \sum_{j=1}^{N} I_{Sj} \quad (19)$$

which is equivalent to a single diode, having a reverse saturation $I_{Stot}$ equal to the algebraic sum of individual reverse saturation currents $I_{Sj}$.

For the special case of N identical parallel diodes $$I_{Stot}=NI_S$$

Having demonstrated that the presence of a single non-linear device within a net of multiple non-linear devices connected to the same conductor can give rise to a measurable change in offset voltage, it becomes possible to use this effect within a test system.

Figure 5:
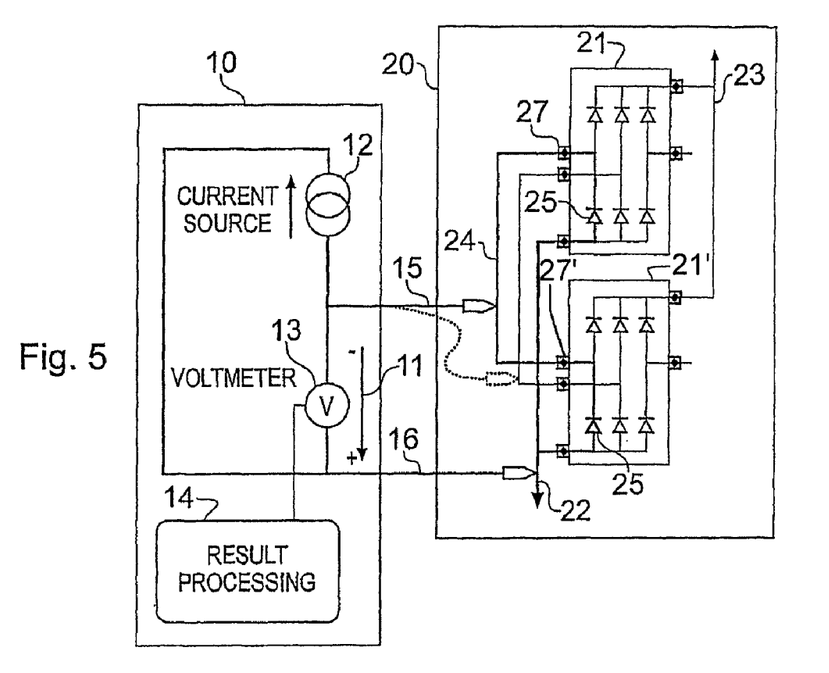
FIG. 5 schematically illustrates the circuit of a tester constituting an embodiment of the present invention.

FIG. 5 illustrates a circuit diagram for a tester constituting an embodiment of the present invention. The tester 10 is shown connected to a board under test 20.

The tester comprises a current source 12 having a first terminal connected to a first movable connection 15 which can be used to make selective electrical connection with a conductor on the board under test, and which makes a connection to a plurality of devices, called a net 24, on the board 20. The connection 15 need not be a single movable probe (which is illustrated for simplicity) but may be made by multiple probes (for example a so called "bed of nails") in conjunction with a suitable switching arrangement.

A current return 16 is connected between a second terminal of the current source 12 and a supply rail, (ie a ground connection 22 or power rail 23) of the board 20. A measuring device 13, such as a voltmeter, is provided in parallel with the current source 12 so as to measure a voltage difference occurring within the net 24 with respect to the supply rail 22 or 23, as appropriate, as a result of the current flowing from the current source 12. An output of the voltmeter 13 is supplied to an input of a data processor 14 which stores a plurality of results from the voltmeter and processes these to provide a measurement of whether a board 20 under test is faulty or correctly connected.

Figure 6:
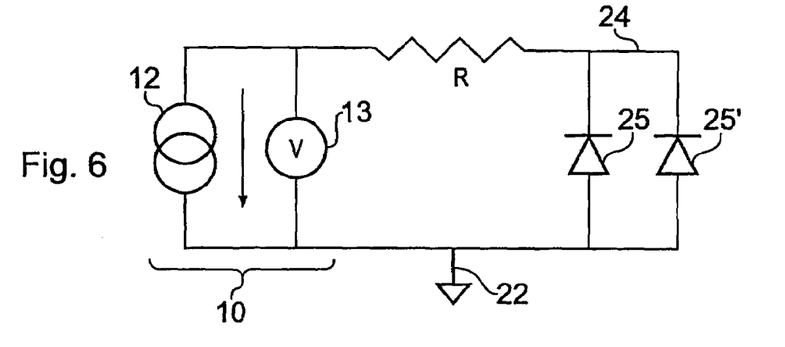
FIG. 6 shows an equivalent circuit of the arrangement shown in FIG. 5.
Figure 7:
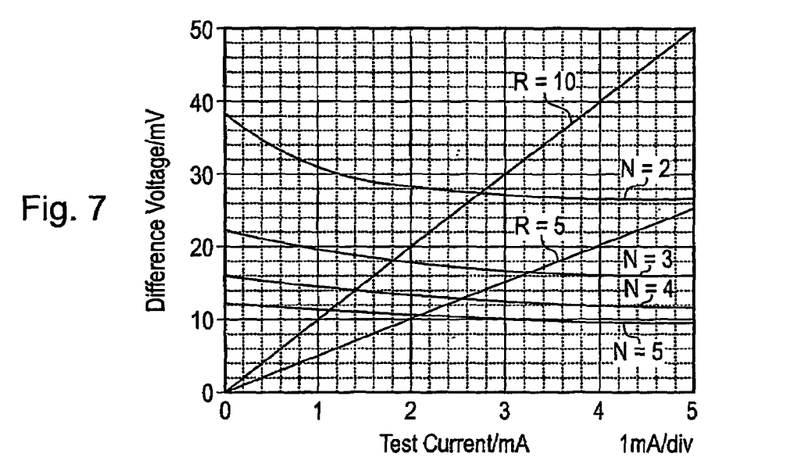
FIG. 7 is a graph comparing series resistance error voltage with expected voltage change due to a single faulty connection.

The board under test 20 includes two connected devices 21 and 21', each having a connection 27 and 27', respectively, to a common net 24 and sharing ground 22 and power 23 rails. FIG. 6 shows an equivalent circuit of the same test configuration within the tester 10. The connections between the tester 10 and circuit under test 20 will have an associated resistance, including that due to routing switches, test wiring, and test probe contact resistance. This combined resistance equates to a series resistance R in the test path, which contributes an unwanted error component, an error voltage, to the detected net voltage. FIG. 7 is a graph comparing the typical series resistance error voltage with the expected difference in net voltage due to a single faulty component connection in the case of various numbers N of connected devices (N=2 . . . 5). It can be seen in FIG. 7, for example, that the error voltage due to a series resistance of 10 Ohms at a test current of just 3 mA, is greater than the expected voltage difference due to a faulty connection of one of two devices (N=2) on a net.

The test methods according to the present invention separate out voltage components due to non-linear and linear load characteristics, and give an indication of connection integrity, which is independent of series resistance in the test path.

In a first method of operation, the current source 12 injects a first current into the net 24, so as to forward bias internal diodes 25 of the connected devices 21. The resultant net voltage 11 is measured by the voltmeter 13 and stored by the data processor 14. A second different current is then injected by the current source into the same net, and a second resultant voltage measured.

A line on the resultant current-voltage curve passing through the two chosen operating points defines an associated dynamic resistance Rd, and due to the non-linear characteristic, crosses the voltage axis at an offset voltage, V0.

The offset voltage $V_0$ is, as already demonstrated, independent of the value of the series resistance in the test path, and is substantially proportional to the natural logarithm of the sum of reverse saturation currents of connected forward-biased diodes. A fault in any one device pin connection will thus result in a change in offset voltage $V_0$, which is conversely indicative of the failure.

Advantageously, the difference in offset voltages between nets subjected to the same test currents may be calculated from the resultant differential net voltages. Such direct differential measurement techniques reduce the total number of required voltage measurements, and have the added benefits afforded by inherent common-mode signal and noise rejection.

Figure 8:
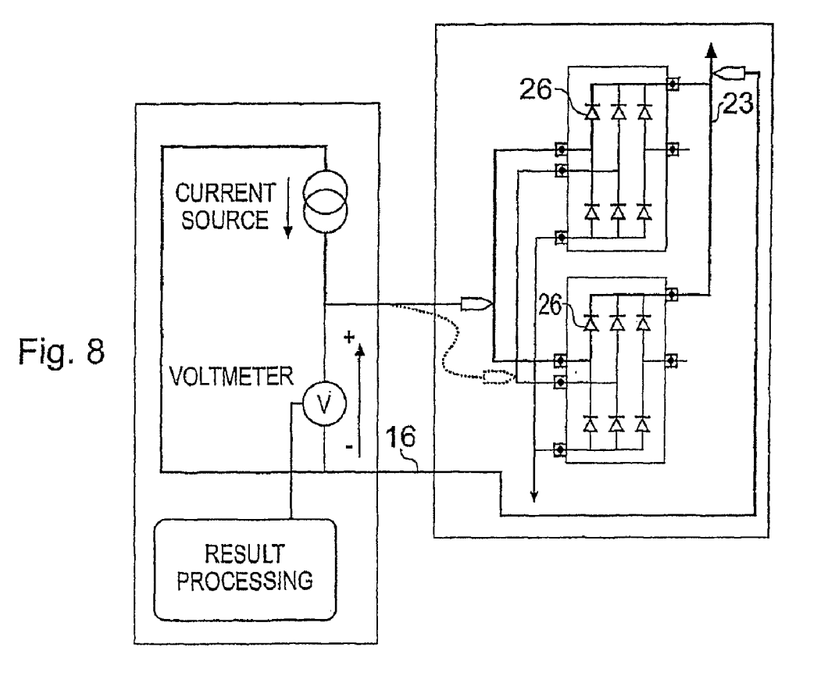
FIG. 8 illustrates an apparatus constituting an embodiment of the present invention arranged to test connections in CMOS devices.

CMOS devices also have additional diodes formed between each I/O pin and the power rail. These are provided as part of anti-static protection measures, or may be parasitic diodes. For these devices, such diodes may be employed equally well for the purposes of contact integrity test FIG. 8 shows the same test apparatus as shown in FIG. 5, but configured to utilize these diodes for test purposes. In this case, the current return connection 16 is taken from the power rail 23, and the polarity of test current chosen so as to forward bias additional diodes 26.

It is indeed possible to connect both ground 22 and power 23 rails together, and to utilize either the diodes to ground or to power rail, by simple choice of suitable test polarity.

The current return connection 16 may be grounded in the tester, if required.

The data processor 14 may be furnished with knowledge of the performance of a known good board and then performance of a net under test can be compared with that of the identical net on the known good board.

Additionally or alternatively the data processor 14 can be provided with knowledge of the number and type of devices connected to each net 24. Thus the data processor can determine which nets should exhibit similar characteristics and can compare these. This has the advantage that the effects of temperature (equation 1 is temperature dependent) and variation in device characteristics between different boards due to changes in device batch, family, or manufacturer ($I_S$ and $\eta$ in equation 8) are effectively cancelled out because of the use of comparison between nets rather than the reliance on measuring absolute values.

Figure 9:
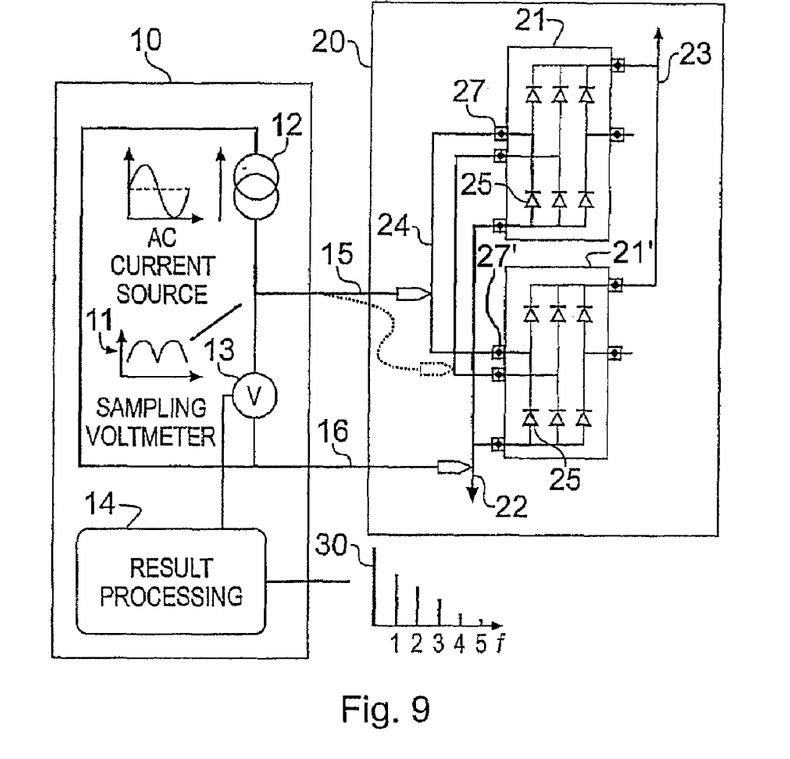
FIG. 9 illustrates an embodiment of a tester in accordance with the present invention and utilising a test signal having an AC component.

In a further embodiment of the present invention the current source 12 additionally includes an alternating current component. Such a tester is shown in FIG. 9.

The harmonic analysis method comprises the steps of applying a current containing a sinusoidally varying component measuring the resultant voltage waveform analysing the harmonic content of the resultant waveform determining a faulty connection on the basis of a difference in harmonic content of the resultant waveform The harmonic response may be compared directly or indirectly with those of similar nets subjected to the same stimulus, resulting in tests which are independent of individual device characteristics.

For forward-biased parallel connected diodes of characteristics, and total reverse saturation current $I_S$, the voltage response is given by $$V = V_{DIODE} + V_{SERIES} = \eta V_T \ln\left(\frac{I}{I_S} + 1\right) + IR_{SERIES} \quad (20)$$

For a current consisting of a dc bias and sinusoidally varying component, $I = I_{BIAS} + I_{MOD} \sin(\omega t)$, the voltage term due to the series resistance can contain only a dc and fundamental frequency component. By contrast, the non-linear transfer characteristic of the diode will result in dc, fundamental, and harmonic components, as demonstrated by the Taylor expansion $$\ln(x) = (x-1) - \frac{(x-1)^2}{2} + \frac{(x-1)^3}{3} - \ldots \quad (21)$$

The harmonic content, starting with the $2^{nd}$ harmonic, can be used as a measure of the (combined) non-linear diode characteristic, and is independent of series resistance in the test path. Typically, a measure of the $2^{nd}$ harmonic alone is sufficient for detecting device connect failures.

Figure 10:
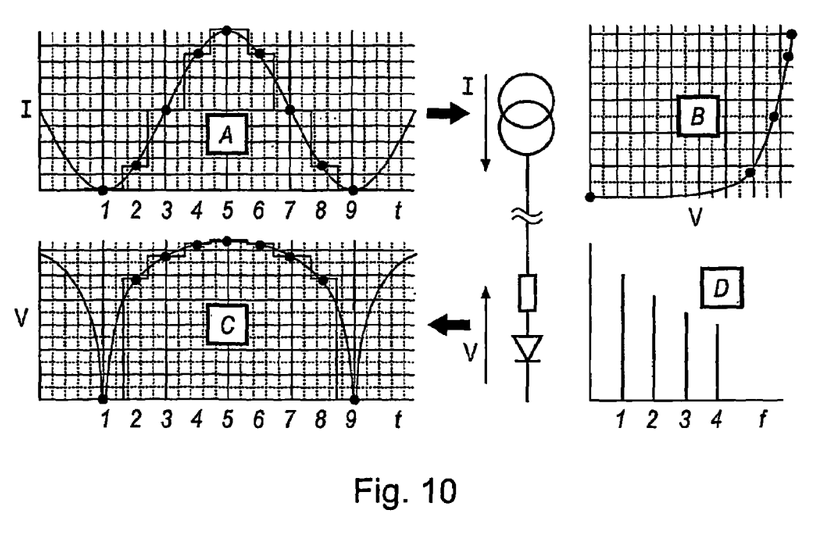
FIG. 10a illustrates a sinusoidal test signal.
FIG. 10b illustrates a non-linear current-voltage characteristic of a diode.
FIG. 10c shows an example of the voltage waveforms developed across the diode and FIG. 10d illustrates the frequency components of a waveform as shown in FIG. 10c.

Thus the sinusoidal signal shown in FIG. 10a is mapped by the non-linear characteristic of FIG. 10b into the modified waveform of FIG. 10c. The harmonic content of which is schematically shown in FIG. 10d.

A measure of one or more additional harmonic components 30 of the resultant voltage waveform 11 detected by voltmeter 13, being due to the transfer characteristic of the non-linear load, is then compared against reference values to verify correct connection of devices on the net.

Typically, a measure of the second harmonic content is sufficient to constitute a valid test. Any voltage component due to linear series resistance will be proportional to the original test current waveform, and cannot otherwise affect the observed harmonic content. Again, responses may be compared against those of other nets of similar type and function.

Advantageously, the difference in harmonic content between nets subjected to the same test currents may be calculated from the resultant differential net voltages, with the aforementioned advantages.

In order that the observed harmonic content of the resultant voltage waveform is independent of series resistance in the test path, the current stimulus waveform must itself exhibit low harmonic distortion. In addition, actual harmonic content measurements typically require either sampling of the voltage waveform, else the use of dedicated synchronous detectors or filters.

Figure 11:
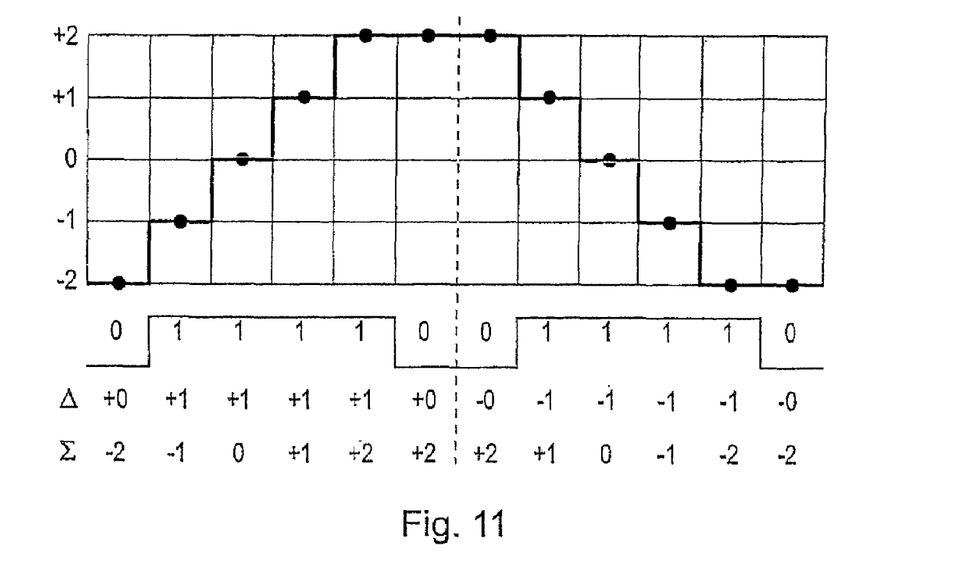
FIG. 11 illustrates the form of a "magic sinewave"

Magic Sinewaves, attributable to Don Lancaster, are repeating binary sequences for producing digital waveforms, having precisely controlled amplitude and deterministically small low-harmonic content. An analog signal having a similar low-harmonic content, and particularly suitable for the harmonic analysis method, can easily be synthesized by passing the same binary sequences through a simple low-resolution digital to analog converter. FIG. 11 shows such an output from a delta-sigma converter, when fed the binary sequence "011110". During the first half-cycle, a "1" in the binary input sequence adds 1 to the current output value, and a "0" maintains the current output value. During the second half-cycle, the binary input sequence is repeated, but in this case, a "1" in the binary input sequence subtracts 1 from the current output value, and a "0" maintains the current output value. The resultant output waveform ideally has zero even-harmonic content due to half-wave symmetry, and zero third harmonic content due to the total cycle length of 12 being exactly divisible by 3.

The harmonic analysis method described so far requires the use of an AC source to provide an alternating current component, and a method of extracting harmonic content from a detected resultant voltage waveform.

A refinement of the above method has been devised whereby an equivalent measure of harmonic content may be derived using only a set of direct current stimuli and measure of respective voltage responses. Harmonic analysis may be performed by applying a time-to-frequency domain transform on data captured by sampling the resultant voltage waveform at regular intervals. For resistive loads having no reactive components, the exact same set of initial sample data would result from performing a set of DC voltage measurements, with no regard to time, using the instantaneous value of the stimulus current at the corresponding sample times, as shown in FIG. 10a. A suitable set of input current values would be a set of equally time-spaced samples of the half-cycle between the minimum and maximum peaks of the emulated input current waveform. The set of resultant voltage measurements can then be mirrored to emulate a complete waveform cycle for analysis, thereby reducing the required number of measurements. It is therefore possible to perform a harmonic analysis of the non-linear load characteristic using a set of DC measurements, using the apparatus of FIG. 5.

In the preceding methods, processed results may be compared against reference values obtained for a known good board, or preferably, against those obtained for similar nets. An improved embodiment of the tester allows direct comparison of net characteristics, giving significant benefits including improved noise immunity and accuracy.

Figure 12:
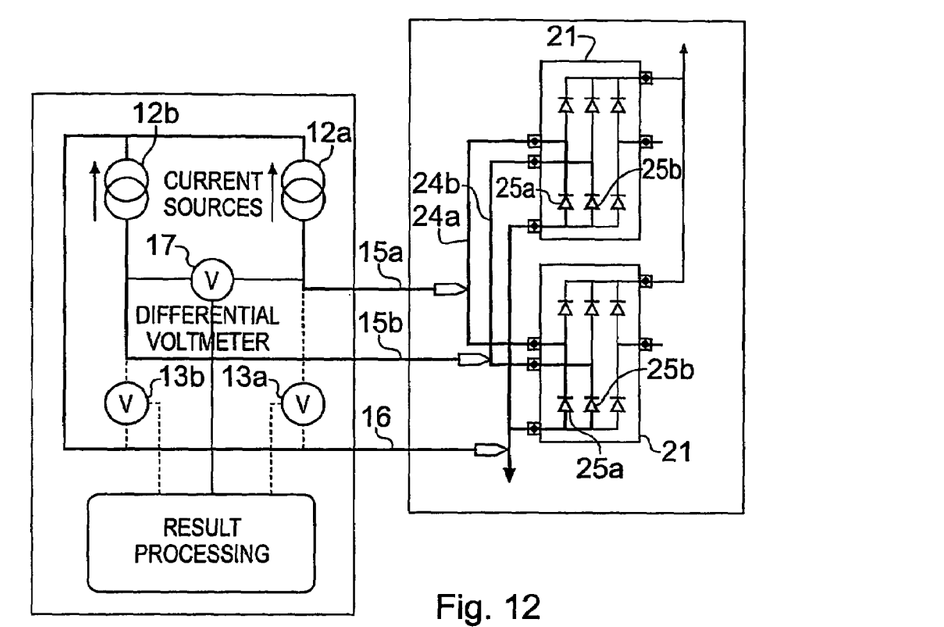
FIG. 12 illustrates a tester constituting a further embodiment of the present invention.

FIG. 12 shows an improved embodiment of the tester., comprising:

A first 12a and second current source 12b for injecting second biasing currents;

A connection 15a between first current source and first device terminal net 24a;

A connection 15b between second current source and second device terminal net 24b;

A detector 17 for measuring the differential voltage between first and second nets; and Optional detectors 13a, 13b for measuring the resultant net voltages.

In operation, the first current source 12a injects one or more currents into the net 24a so as to forward bias internal diodes 25a of the connected devices 21. At the same time, the second current source 12b injects one or more currents into a second net 24b so as to forward bias internal diodes 25b of the same connected devices 21.

Each of the previously described methods may now be applied as before, with the following modifications:

For each measurement, the second current source 12b injects the exact same current into the second net (24b) as the first. The voltage from the detector 17, being the difference in resultant voltages between the two nets 24a, 24b, is used in place of detected absolute net voltage 13. On the basis of one or more measurements, a non-linear component, being the difference in non-linear components for each of the two nets 24a, 24b is extracted using the difference values from detector 17. The processed non-linear component may now be used directly as an indication of connection integrity.

This has the advantage of speeding the test process since only a single non-linear component need be extracted to indicate the matching of nets 24a, 24b. An additional advantage is that the common mode signal and noise rejection inherent to such a method renders more accurate and less variable measurements.

Figure 13:
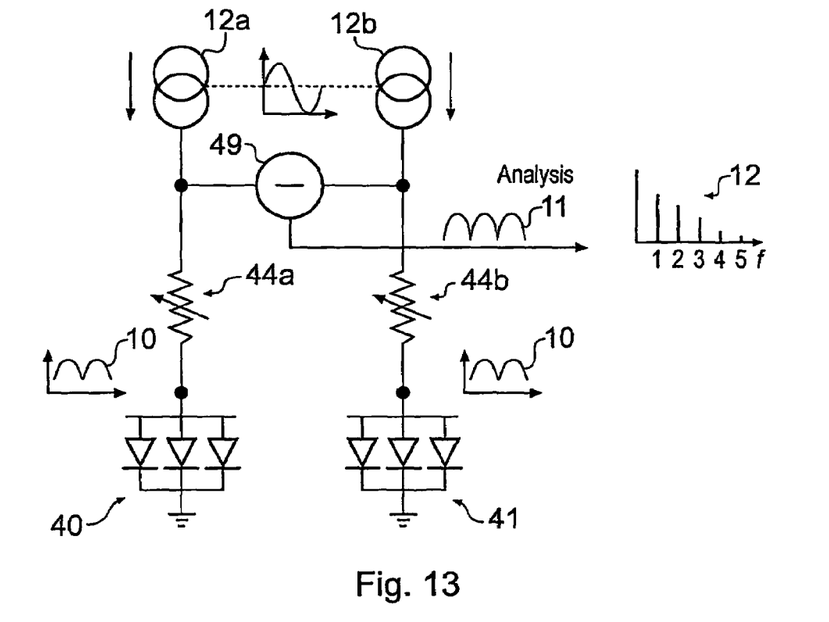
FIG. 13 illustrates an apparatus for performing direct differential harmonic analysis so as to detect faulty connections.

FIG. 13 shows a diagrammatic representation of a direct differential harmonic analysis method, which may be implemented using described the methods with a tester apparatus shown in FIG. 12. The matched current sources 12a and 12b supply identical currents into the nets 40 and 41 (FIG. 13) which are similar in both the number and type of device connections. Variable resistors 44a and 44b represent unknown and unwanted series resistance in the test path. The non-linear elements in each path generate harmonics whose voltages are detected and fed to a subtractor 49. The subtractor 49 forms the difference between the voltages occurring in nets 40 and 41 and outputs this. If the nets substantially match one another, then the harmonic content of the output 11 of the subtractor should be substantially zero. Due to the use of current stimuli, a mismatch in values of series resistances 44a and 44b can result only in a fundamental component in output 11, which may be ignored for the purposes of fault detection. However if one net contains a faulty device connection then the nets will not match one another and the output of the subtractor should contain significant amounts of fundamental and harmonic components. Again, the fundamental component can be ignored to give a test independent of values of series resistance 44a and 44b. Typically, the $2^{nd}$ harmonic content alone provides sufficient indication of the matching of nets.

The methods presented thus far may be used to detect a faulty device connection to a net, with no inherent discrimination of the particular failing connection. In the case of a faulty connection of one of several devices on a net, it is desirable to further determine the particular device connection at fault Any of the above techniques may be extended to include such fault isolation diagnostics discussed below.

Figure 14:
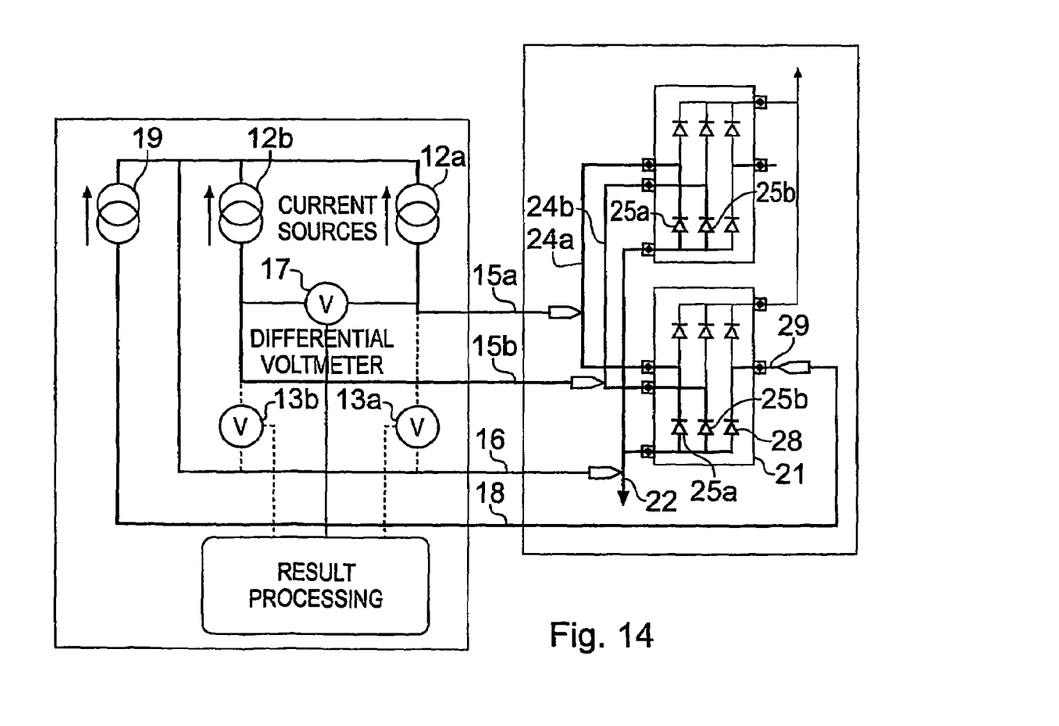
FIG. 14 shows a further tester-constituting an embodiment of the present invention.

FIG. 14 shows a further improved embodiment of a tester suitable for diagnosing particular device connection faults. The tester comprises in addition:

A third current source 19 for injecting an additional current

A connection 18 between additional current source 19 and another device terminal 29.

In use, tests are configured and performed as previously described. The following diagnostic steps need only be taken in the case that a fault has already been detected. An additional current is injected by the third current source 19 into another terminal 29 of one of the devices on the net under test The terminal 29 is chosen so as to connect to only one of the devices common to the nets 24 under test. The initial test is then repeated, noting the difference in result due to the additional current. It has been found that, if the difference in result is greater than a certain magnitude, and of a given sign (related to the additional injected current), then the initial fault can be attributed to the particular device chosen for injecting additional current into terminal 29. If the noted difference is greater than a certain magnitude, and of opposite given sign, then the fault can be attributed to a device other than that chosen. In the case that the difference in result is of insufficient magnitude to attribute the fault, then the above steps may be repeated for each other device connected to the failed net. A comparison of the noted responses for each device may then be used to discriminate the faulty device connection.

Figure 15:
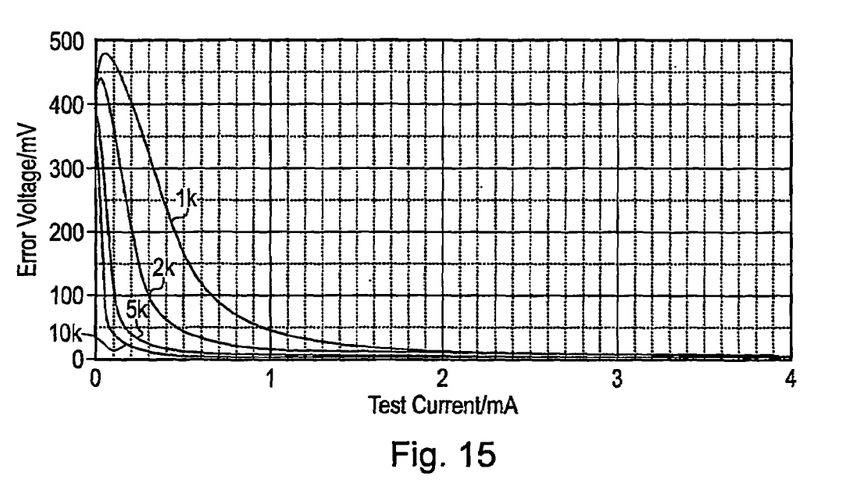
FIG. 15 is a graph showing the error in forward voltage measurements resulting from the presence of a parallel resistive load.

In a board under test, an external resistance is occasionally connected between a device terminal and the power or ground rails. Unpredictable results may result from test current flowing through such resistance, rather than through device diodes. FIG. 15 shows the error in forward voltage resulting from various values of parallel resistive load, plotted against test current.

The effects of external resistance may be reduced through use of increased test currents, thereby making the proportion of current flowing though the resistance less significant Another solution is to balance external resistance for nets being compared, for example by connecting and additional parallel resistance. The value of additional parallel resistance may be determined by measuring actual external resistances at a very low voltage, such that the non-linear impedance of the diodes becomes insignificant. A selectable or programmable resistance of the correct magnitude may then be connected in parallel to one or other net in order to balance net currents.

In the described methods, measurement results may be directly or indirectly compared within groups of nets having similar characteristics. Such net groups may be defined as those for which each node of every net in the group has a corresponding well-matched node in all other nets of the group. Well-matched nodes are those groups of pins on a single device having similar input/output type and function. The process of identifying these net groups may be performed by manual or automatic inspection of circuit and device data. An additional step of verifying net grouping may be performed by making measurements on a known good board, according to known methods.

The invention claimed is:

1. A method of testing the continuity of a connection between an integrated circuit pin and a circuit board where the integrated circuit pin is connected to a plurality of integrated circuit pinsfonning a first group, the method comprising the steps of:
   identifying a second group of integrated circuit pins having electrical properties relatable to the first group;
   applying one or more first test signals to the first group of pins and measuring one or more respective first voltage differences occurring between the first group of pins and a reference voltage;
   applying one or more second test signals to the second group of pins and measuring one or more respective second voltage differences occurring between the second group of pins and a reference voltage; and
   on the basis of the measurements, extracting and comparing a non-linear characteristic of the first and second groups of pins to obtain a measure of said continuity.

2. An apparatus for testing the continuity of connections in a circuit path within a product, said path comprising a plurality of integrated circuit device pins forming a first group connected to a first circuit node such that current flows via the pins and through associated semiconductor junctions to a second circuit node, the apparatus comprising:
   a first tester for applying M test signals to the first group of pins and measuring M voltage differences occurring between the first circuit node and a reference, where hi is an integer greater than zero;
   a second tester for applying N test signals to a second group of pins expected to have a behavior identical to or relatable to the first group of pins and measuring N voltage differences occurring between a second circuit node connected to the second group of pins and a reference, where N is an integer greater than zero; and a processor responsive to the voltage differences for deriving or comparing a non-linear characteristic of the first and second groups of pins to obtain a measure of said continuity.

3. An apparatus as claimed in claim 2, in which the first and second groups comprise the same number of device pins.

4. An apparatus as claimed in claim 3, in which each device connection in the first group has a corresponding device connection in the second group being members of the same or similar family of device technologies and of similar function.

5. An apparatus as claimed in claim 3, in which the first and second non-liner characteristics are compared and a faulty connection is indicated by the data processor if the difference between them exceeds a first threshold.

6. An apparatus as claimed in claim 3, in which the M test signals and the N test signals are substantially identical current waveforms.

7. Apparatus as claimed in claim 2, in which the M test signals and the N test signals are DC signals of switchable value and voltage offsets are calculated from the voltage differences, the offsets are compared and a faulty connection is indicated if the difference in offsets exceeds a threshold value.

8. An apparatus as claimed in claim 3, in which the M test signals and the N test signals comprise an AC component superimposed on a DC component and the magnitude of harmonic components of the voltage differences are compared and a faulty cotuiection is indicated if the difference in harmonic components exceeds a threshold value.

9. An apparatus as claimed in claim 2, in which the comparison of non-linear characteristics is performed directly by extracting a non-linear characteristic based on forming a difference between the first voltage difference and the second voltage difference.

10. An apparatus as claimed in claim 2, wherein the first and second testers are adapted such that the test signals applied to the groups of pins comprise discrete time samples of a sinusoidal or other waveform having little or zero low-order harmonic content and the testers are further adapted to use the measured voltage differences as discrete samples in reconstructing the response to a sinusoidal or other waveform having little ar zero harmonic content input for harmonic analysis.

11. An apparatus as claimed in claim 2, further comprising a further test signal generator for generating a probe current which is injected via a further device connection into a selected integrated circuit, and wherein the continuity test is repeated and the selected integrated circuit is indicated as having an unacceptable connection if the nonlinear characteristic varies by more than a first predetermined threshold, or is indicated as having an acceptable connection if the non-linear characteristic varies by more than a second predetermined threshold of opposite sign to die first predetermined threshold.

* * * * *

UNITED STATES PATENT AND TRADEMARK OFFICE
CERTIFICATE OF CORRECTION

PATENT NO. : 7,385,410 B2
APPLICATION NO. : 10/533188
DATED : June 10, 2008
INVENTOR(S) : Payman Page 1 of 1

It is certified that error appears in the above-identified patent and that said Letters Patent is hereby corrected as shown below:

Column 14,

Line 37, "pinsfonning" should read --pins forming--;

Line 60, "hi" should read --M--.

Column 15,

Line 14, "non-liner" should read --non-linear--.

Column 16,

Line 1, "cotuiection" should read --connection--;

Line 15, "ar" should read --or--;

Line 26, "die" should read --the--.

Signed and Sealed this

Nineteenth Day of August, 2008

JON W. DUDAS
*Director of the United States Patent and Trademark Office*